United States Patent [19]

Ikuta

[11] 4,086,696

[45] May 2, 1978

[54] PACKAGING METHOD OF A CIRCUIT FOR AN ELECTRONIC WATCH

[75] Inventor: Yasuo Ikuta, Ichikawa, Japan

[73] Assignee: Kabushiki Kaisha Daini Seikosha, Japan

[21] Appl. No.: 683,619

[22] Filed: May 5, 1976

[30] Foreign Application Priority Data

May 8, 1975 Japan .................................. 50-55762

[51] Int. Cl.² ........................ H01R 43/02; H05K 3/32
[52] U.S. Cl. ......................................... 29/627; 29/177; 29/628; 58/23 A; 174/52 PE
[58] Field of Search ................. 29/627, 626, 628, 588, 29/577, 177; 58/23 R, 23 A, 23 AC, 50 R, 52 R, 55; 174/52 PE, 68.5

[56] References Cited

U.S. PATENT DOCUMENTS

| | | | |
|---|---|---|---|
| 3,791,025 | 2/1974 | Guarjado | 29/627 X |
| 3,863,436 | 2/1975 | Schwarzschild | 58/50 R |
| 3,981,138 | 9/1976 | Levine et al. | 58/23 R |
| 3,999,285 | 12/1976 | Lewis | 29/588 |

*Primary Examiner*—Carl E. Hall
*Attorney, Agent, or Firm*—Robert E. Burns; Emmanuel J. Lobato; Bruce L. Adams

[57] ABSTRACT

A method of manufacturing a circuit assembly for an electronic watch without use of a printed circuit board comprises bonding an IC chip to the surface of a lead frame and then wire-bonding the IC chip terminal pads to respective bonding conductors. The lead frame is superposed on a thermoplastic resin base plate and preselected parts of the base plate are melted so as to fix and connect together the lead frame and base plate as the melted parts harden. The IC chip and wire-bond connections are then potted with synthetic resin to form the completed circuit assembly. A thermoplastic resin cover plate may be disposed atop the lead frame except for the region of the IC chip and wire-bond connection and fixed to the head frame during the melting step.

7 Claims, 9 Drawing Figures

PACKAGING METHOD OF A CIRCUIT FOR AN ELECTRONIC WATCH

BACKGROUND OF THE INVENTION

This invention relates to a packaging method of circuit elements for an electronic watch such as an IC chip or an oscillator etc. which are fixed on a base plate.

In a conventional electronic watch, after a packaged IC chip and other circuit elements are fixed on a printed circuit board, the assembled board is incorporated in a watch. Such a construction is disadvantageous because a large space is required for housing the electronic circuit, a complicated assembling process is needed to assemble the watch, thereby making it difficult to lower the manufacturing cost, and such watches were lacking in reliability.

For overcoming the above defects, it has been proposed to fix a base IC chip directly to a printed circuit board together with other circuit elements. However, according to this method, it is not possible to us an automatic bonding machine of the heat-pressing type using gold wire for wire bonding between the IC chip and the printed conductors, and therefore the bonding process can not be carried out efficiently. Moreover, to make matters worse, the shape of the printed circuit board can not be choose freely to fit the other watch parts.

SUMMARY OF THE INVENTION

The object of this invention is to provide a new and improved packaging method for assembly of a circuit for an electronic watch.

According to the packaging method of this invention, there is provided a lead frame for a watch circuit having a pattern of conductors to interconnect the terminal pads of an IC chip with other electronic parts. There is also provided a base plate made from thermoplastic resin which serves as the base plate for the watch circuit and which is configured to function as a bearing holder for a gear train and a battery holder for a battery.

During assembly, the IC chip is die bonded on the lead frame and after that, the IC chip terminal pads are wire bonded to the lead frame conductors. The lead frame is superposed on the base plate, and the two fixed together by adding heat to melt a part of them and then the IC chip is potted by resin. As mentioned above, since the conventional type printed circuit board is eliminated, various advantages ensue.

Other objects and advantages of this invention will be apparent to one skilled in the art from the following description taken in conjunction with the accompanying drawings.

DETAILED DESCRIPTION OF THE INVENTION

Figures 1, 2A, 2B, 2C, 2D:
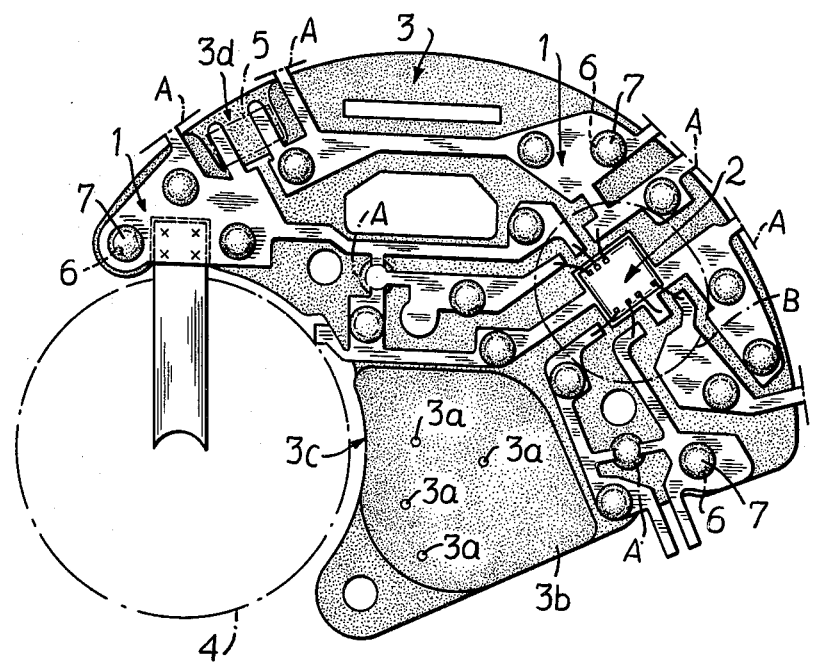
FIG. 1 shows part of a movement for an electronic watch made by the packaging method of this invention.
FIGS. 2(A)–2(D) show the packaging steps according to one embodiment of this invention and FIGS. 3(A)–3(D) show the packaging steps according to another embodiment of this invention.

Now referring to FIG. 1, a lead frame 1 defining a patten of lead frame conductores and being comprised of copper plate or the like is initially formed in one piece. An IC chip 2 is mounted on the lead frame 1 and then the frame is cut away at predetermined portions as shown by chained lines A to separate the carious lead frame conductors. The IC chip 2 mounted and fixed on the lead frame 1 is then potted in place by synthetic resin for sealing the various connections, the potted area being shown by chained line B.

The base plate 3 of the watch is made from thermoplastic resin such as polysulfone resin, and has a bearing surface portion 3b for supporting the gear train whose shafts extend into holes 3a, a cut out portion 3c in which is positioned a battery 4 and a recess portion 3d for fixing a condenser 5. The lead frame 1 has a plurality of holes 6, extending therethrough and the base plate 3 has a plurality of projections 7 which correspond to and register with the holes 6 when the frame 1 and plate 3 are placed in alignment one atop the other. When the lead frame 1 is disposed on the base plate 3, each projection 7 passes through a respective one of the holes 6. Then by heating the top of each projection 7, it is caulked by melting and the lead frame 1 is thereby fixed on the base plate 3.

FIG. 2 shows a series of packaging steps according to one embodiment of this invention. In FIG.2(A), an IC chip 2 is placed on the die bonding area of a lead frame 1 and then die bonded thereto. Each bonding pad of the IC chip 1 is then wire bonded to the lead frame conductors to establish electrical connection.

In FIG. 2(B), the lead frame 1, with the IC chip 2 attached, is disposed on a base plate 3 and projections 7 of the base plate 3 are inserted in holes 6 of the lead frame 1.

In FIG. 2(C), the connection of the frame 1 and plate 3 is effected by melting the top of each projection 7 by thereby fixing the lead frame 1 on the base plate 3. This operation work is the so called "caulking" technique.

In FIG. 2(D), epoxy resin 8 is potted on the area where the IC chip 2 and bonded wires are located for purposed of protection. Needless to say, the cutting process of the lead frame 1 can be carried out before or after the potting process.

Other electronic parts, such as a condenser and a quartz crystal vibrator, may be connected to the lead frame 1 after it is fixed to the base plate 3. Alternatively, aforementioned electronic parts or other parts may be connected to the lead frame 1 before it is fixed to the base plate 3.

According to one feature of this invention, the lead frame 1 is fixed to the base plate 3 by inserting projections made on the latter into holes made on the former and melting the top of each projection. However, holes and projections are not necessarily needed and the lead frame 1 may be fixed to the watch parts by melting some other portions thereof.

FIG. 3 shows another series of packaging steps according to another embodiment of this invention, wherein the lead frame 1 is sandwiched between the base plate 3 and a covering plate 9 which is made by thermoplastic resin and dimensioned to cover the whole area of the circuit.

Figure 3A:

First of all, the IC chip 2 is die bonded on the lead frame 1 and is wire bonded to the lead frame conductors as shown in FIG. 3(A).

Figure 3B:
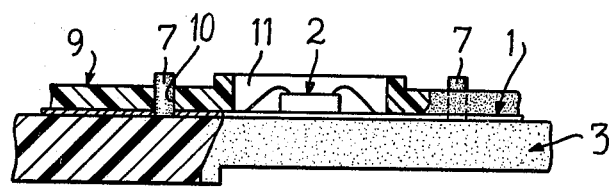

In FIG. 3(B), the lead frame 1 is positioned on the base plate 3 which, in this embodiment, has projections 7 of longer extent than in the first embodiment. The covering plate 9 is disposed atop the frame 1 and has holes 10 therein receiving there through the projections. The covering plate 9 has an opening area 11 which surrounds the IC chip 2 and forms a housing for containing the epoxy resin.

Figure 3C:
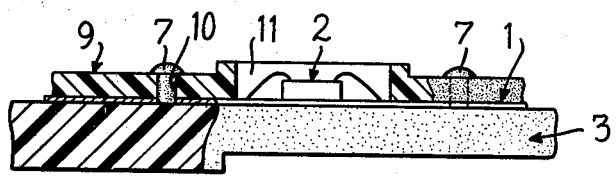

In FIG. 3(C), heat is applied to the top of each projection 7 so that the three elements 1, 3 and 9 are integrally connected in one piece by the so called heat-caulking technique.

Figure 3D:
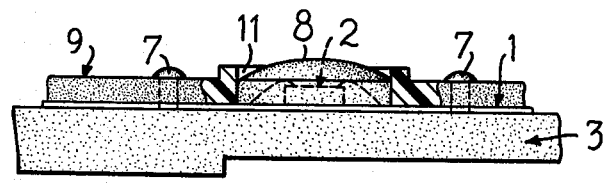

In FIG. 3(D), epoxy resin 8 is potted into the open area 11 of the covering plate 9, the IC chip 2 is packaged.

Modifications may be made and, for example, the three elements 1, 3 and 9 may be integrally joined by ultrasonic welding in which case the projections 7 and the holes 6 and 10 can be eliminated.

Hence, it is desired that the foregoing shall be considered merely as illustrative and not in a limiting sense.

I claim:

1. A method of manufacturing a circuit assembly for an electronic watch without use of a printed circuit board, comprising the steps of: providing a lead frame having a pattern of lead frame conductors, an IC chip having terminal pads for connection to other circuitry, and a base plate comprised of thermoplastic resin; bonding said IC chip to a surface portion of said lead frame; wire-bonding the IC chip terminal pads to respective lead frame conductors; superposing said lead frame on said base plate; melting preselected parts of the thermoplastic resin base plate while said lead frame is superposed thereon to thereby fix and connect together said lead frame and base plate as the melted parts harden; and potting with synthetic resin the IC chip and wire-bonded connections to effect sealing thereof thereby forming a circuit assembly for an electronic watch.

2. A method according to claim 1; wherein said providing step includes providing a base plate having a set of projections; and said melting step comprises melting said projections to fix and connect together said lead frame and base plate.

3. A method according to claim 2; wherein said providing step includes providing a lead frame having a set of openings therein positioned to register with respective ones of the base plate projections; said superposing step comprises superposing said lead frame on said base plate such that said base plate projections extend through and project above respective ones of said base plate openings; and wherein said melting step comprises melting the ends of said base plate projections which project above said base plate openings to fix and connect together said lead frame and base plate.

4. A method according to claim 1; wherein said steps of bonding and wire-bonding are carried out after said steps of superposing and melting.

5. A method according to claim 1; wherein said steps of bonding and wire-bonding are carried out before said steps of superposing and melting.

6. A method according to claim 5; further including, before said melting step, disposing a cover plate comprised of thermoplastic resin atop said lead frame so as to cover said lead frame except for the region of said IC chip and wire-bond connections; and wherein said melting step comprises melting preselected parts of the thermoplastic base plate to fix and connect together in a sandwiched assembly said cover plate, lead frame and base plate.

7. A method according to claim 6; wherein said lead frame and cover plate have a set of aligned openings extending therethrough and said base plate has projections which extend through and project above respective ones of the aligned opening; and wherein said melting step comprises melting the ends of said base plate projections which project above said aligned openings to fix and connect together said sandwiched assembly.

* * * * *